United States Patent [19]

Nakajima

[11] Patent Number: 5,761,044
[45] Date of Patent: Jun. 2, 1998

[54] SEMICONDUCTOR MODULE FOR MICROPROCESSOR

[75] Inventor: Hirofumi Nakajima, Tokyo, Japan

[73] Assignee: NEC Corporation, Tokyo, Japan

[21] Appl. No.: 967,201

[22] Filed: Oct. 29, 1997

Related U.S. Application Data

[63] Continuation of Ser. No. 601,544, Feb. 14, 1996, abandoned.

[30] Foreign Application Priority Data

Feb. 14, 1995 [JP] Japan ................................. 7-024858

[51] Int. Cl.$^6$ ................................................. H05K 7/20
[52] U.S. Cl. ...................... 361/719; 174/16.3; 257/713;
257/722; 361/704; 361/707
[58] Field of Search .................................. 165/80.2, 185;
174/16.3; 257/707, 711–713, 720, 722,
731–733; 361/704, 707, 709–710, 715–722,
761, 764

[56] References Cited

U.S. PATENT DOCUMENTS

| | | | |
|---|---|---|---|
| 4,860,165 | 8/1989 | Cassinelli | 361/710 |
| 5,172,303 | 12/1992 | Bernardoni et al. | 361/393 |
| 5,297,006 | 3/1994 | Mizakoshi | 361/704 |
| 5,367,193 | 11/1994 | Malladi | 361/707 |
| 5,404,273 | 4/1995 | Akagawa | 361/707 |
| 5,557,502 | 9/1996 | Banerjee et al. | 361/712 |

FOREIGN PATENT DOCUMENTS 4-280695  10/1992  Japan .

OTHER PUBLICATIONS

Research Disclosure "Thermal Hinged Heat Sink", Apr. 1988, No. 288, p. 361/304.

*Primary Examiner*—Gregory D. Thompson
*Attorney, Agent, or Firm*—Sughrue, Mion, Zinn, Macpeak & Seas, PLLC

[57] ABSTRACT

A semiconductor package includes a microprocessor semiconductor device housed in a recess which is defined in a surface of a plastic grid array package which supports terminals that are to be connected to a wiring board when the semiconductor package is mounted on the wiring board. A plurality of cache memories each comprising a ball grid array package are mounted on a surface of the plastic grid array package which is opposite to the surface on which the terminals are supported. A heat sink is mounted in a region of the plastic grid array package which corresponds to the recess.

25 Claims, 4 Drawing Sheets

SEMICONDUCTOR MODULE FOR MICROPROCESSOR

This is a Continuation of application Ser. No. 08/601,544 filed Feb. 14, 1996 now ABN.

BACKGROUND OF THE INVENTION

1. Field of the Invention

The present invention relates to a semiconductor module for a microprocessor, and more particularly to a semiconductor module composed of a plurality of ball grid array packages stacked in an optimum structure for high processing speed.

2. Description of the Related Art

Heretofore, known semiconductor modules for use in microprocessors include a multichip module comprising a plurality of semiconductor devices assembled in a single package. There is also known a ball grid array package which comprises a composite substrate composed of glass fiber cloth and an organic material and a plurality of conductive balls mounted on a reverse side of the composite substrate and electrically connected to a semiconductor device mounted on a face side of the composite substrate. The ball grid array package may be mounted on a wiring board by the conductive balls. The ball grid array package can easily be positioned by way of self-alignment of the conductive balls, and can be produced with a high yield.

FIG. 1 of the accompanying drawings shows a semiconductor module which is composed of such ball grid array packages. As shown in FIG. 1, a plurality of ball grid array packages 101 each supporting a semiconductor device thereon are stacked substantially parallel to each other with given spaced intervals therebetween, and assembled into a laminated structure by reflow soldering. For details, reference should be made to Japanese laid-open patent publication No. 4-280695.

The conventional semiconductor modules are capable of having an increased storage capacity. However, if they are used as a module in a microprocessor having a high processing speed, then they suffer the following drawbacks:

(1) Since a microprocessor has a large power requirement and generates a large amount of heat, the package has to be of a heat-radiating structure. However, the multichip module structure or the laminated ball grid array package structure has no sufficient heat-radiating capability.

(2) A cache memory associated with a microprocessor usually has 100 or more input and output terminals. If a cache memory is mounted on a ball grid array package, its terminals may be disposed on the reverse side thereof, but no region for connecting the terminals is available on the face side thereof. Therefore, ball grid array packages each with a cache memory cannot be stacked and connected, i.e., a plurality of cache memories cannot be mounted on ball grid array packages.

U.S. Pat. No. 5,172,303 discloses an electronic component assembly composed of a stack of two carriers each supporting an electronic component thereon. Solder balls are disposed on a bottom surface of the upper carrier, and the upper and lower carriers are electrically connected to each other by these solder balls. Solder balls are also disposed on a bottom surface of the lower carrier, and the electronic component assembly is mounted on a printed board by these solder balls. The disclosed electronic component assembly suffers the above problems because carriers of identical shape are stacked.

SUMMARY OF THE INVENTION

It is therefore an object of the present invention to provide a semiconductor module for a microprocessor which has a high heat-radiating capability and may incorporate a plurality of ball grid array packages.

To achieve the above object, there is provided in accordance with the present invention a semiconductor package for a microprocessor comprising a plastic grid array package including a surface supporting a plurality of terminals to be connected when the semiconductor package is mounted on a wiring board, the surface having a recess defined therein, a microprocessor semiconductor device housed in the recess, a plurality of cache memories each comprising a ball grid array package, the cache memories being mounted on a surface of the plastic grid array package opposite to the surface which supports the terminals, and heat-radiating means mounted on the surface on which the cache memories are mounted, at a position corresponding to the recess, for radiating heat generated by the microprocessor semiconductor device. The recess may be defined by a through hole defined in the plastic grid array package and a metal plate closing the through hole at the surface on which the cache memories are mounted, with the heat-radiating means being mounted on the metal plate. Alternatively, the recess may be defined centrally in the plastic grid array package, with the cache memories being disposed in surrounding relationship to the recess.

According to the present invention, there also is provided a semiconductor package for a microprocessor comprising a plastic grid array package including a surface supporting a plurality of terminals comprising conductive balls to be connected when the semiconductor package is mounted on a wiring board, the surface semiconductor device housed in the recess, and a plurality of cache memories each comprising a ball grid array package, the cache memories being mounted on a surface of the plastic grid array package opposite to the surface which supports the terminals, the surface on which the cache memories are mounted including a portion corresponding to the recess, the portion serving as a region for installing heat-radiating means for radiating heat generated by the microprocessor semiconductor device after the terminals are connected to the wiring board. The recess may be defined by a through hole defined in the plastic grid array package and a metal plate closing the through hole at the surface on which the cache memories are mounted, with the heat-radiating means being mounted on the metal plate. Alternatively, the recess may be defined centrally in the plastic grid array package, with the cache memories being disposed in surrounding relationship to the recess.

With the above arrangement, the microprocessor semiconductor device is housed in the recess defined in the surface of the plastic grid array package which supports the terminals, and the cache memories are mounted on the opposite surface of the plastic grid array package. Specifically, the microprocessor semiconductor device is mounted on the reverse side of the plastic grid array package, and the cache memories are mounted on the face side of the plastic grid array package. Each of the cache memories comprises a ball grid array package, and is supported by the plastic grid array package. Therefore, the coefficients of thermal expansion of these components are substantially equal to each other, and soldered junctions thereof are free from undue strain.

The heat-radiating means is mounted on a portion of the face side of the plastic grid array package which corresponds to the recess. Therefore, while the cache memories are supported on the plastic grid array package, the semiconductor module can efficiently radiate heat generated by the microprocessor semiconductor device.

In the case where the terminals comprise conductive balls for allowing the semiconductor module to be positioned well, the semiconductor module is mounted on the wiring board by reflow soldering. If the heat-radiating means were already installed, the heat applied by reflow soldering would be dissipated by the heat-radiating means, and junctions between the terminals and the wiring board would not be heated as desired. According to the present invention, the portion of the face side of the plastic grid array package which corresponds to the recess serves as a region for installing the heat-radiating means, and after the semiconductor module is installed on the wiring board, the heat-radiating means is mounted in the region. Therefore, the semiconductor module can easily be soldered to the wiring board.

If the recess is defined by a through hole defined in the plastic grid array package and a metal plate closing the through hole at the surface on which the cache memories are mounted, with the microprocessor semiconductor device being mounted on the metal plate, then the microprocessor semiconductor device is mounted on the heat-radiating means by the metal plate. This arrangement allows heat generated by the microprocessor semiconductor device to be radiated efficiently.

If the recess is defined centrally in the plastic grid array package, with the cache memories being disposed in surrounding relationship to the recess, then wires interconnecting the cache memories and the microprocessor semiconductor device have substantially the same length, and are of minimal length. As a consequence, the delay speeds of the cache memories are equalized and lowered, permitting the cache memories to be used in ideal conditions.

The above and other objects, features, and advantages of the present invention will become apparent from the following description with reference to the accompanying drawings which illustrate examples of the present invention.

DETAILED DESCRIPTION OF THE PREFERRED EMBODIMENTS

1st Embodiment:

A semiconductor module for a microprocessor according to a first embodiment of the present invention will be described below with reference to FIGS. 2 through 4.

Figure 1:
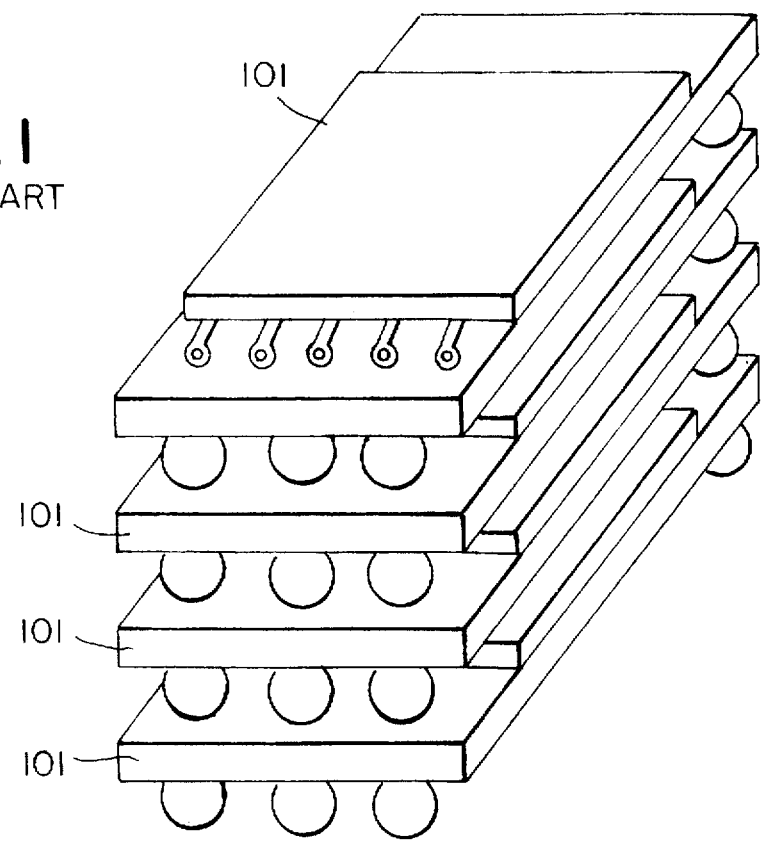
FIG. 1 is a perspective view of a conventional semiconductor module which comprises a plurality of ball grid array packages.
Figure 2:
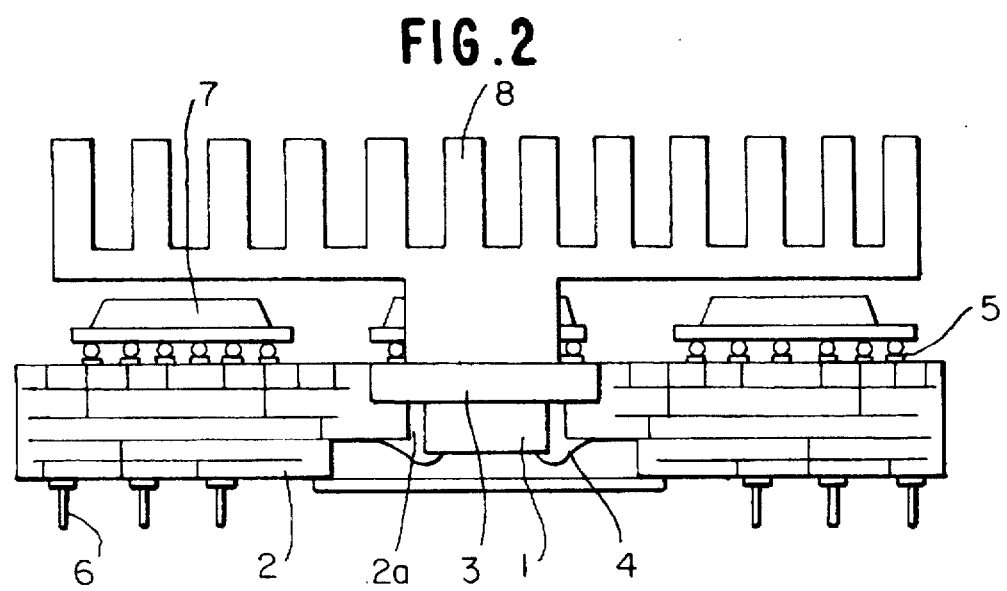
FIG. 2 is a cross-sectional view of a semiconductor module for a microprocessor according to a first embodiment of the present invention.

As shown in FIG. 2, a semiconductor module for a microprocessor according to a first embodiment of the present invention includes a plastic pin grid array 2 comprising a plurality of stacked composite substrates each composed of glass fiber cloth and an organic material. The plastic pin grid array 2 has a central through hole 2a defined therein which is closed by a copper plate 3 of good thermal conductivity, that is attached to an upper surface of the plastic pin grid array 2. A microprocessor semiconductor device 1 is mounted on a lower surface of the copper plate 3. More specifically, a recess is defined in a lower portion of the plastic pin grid array 2 by the through hole 2a and the copper plate 3, and the microprocessor semiconductor device 1 is housed in the recess.

A heat sink 8 as a heat-radiating means is attached to a face side of the copper plate 3. Heat generated by the microprocessor semiconductor device 1 is transferred through the copper plate 3 and radiated from the heat sink 8. The heat sink 8 comprises a leg held in contact with the copper plate 3 and a main heat radiator composed of a plurality of heat-radiating fins. The main heat radiator is positioned above and spaced upwardly from the plastic pin grid array 2 with a gap left therebetween which is large enough to accommodate a plurality of cache memories 7 therein. The main heat radiator extends in a direction parallel to a face side of the plastic pin grid array 2. The main heat radiator thus provides a sufficient region for accommodating the cache memories 7 while it is capable of efficiently radiating heat.

A lower end of the through hole 2a in the plastic pin grid array 2 is covered with a lid member for protecting the microprocessor semiconductor device 1.

Figure 8:
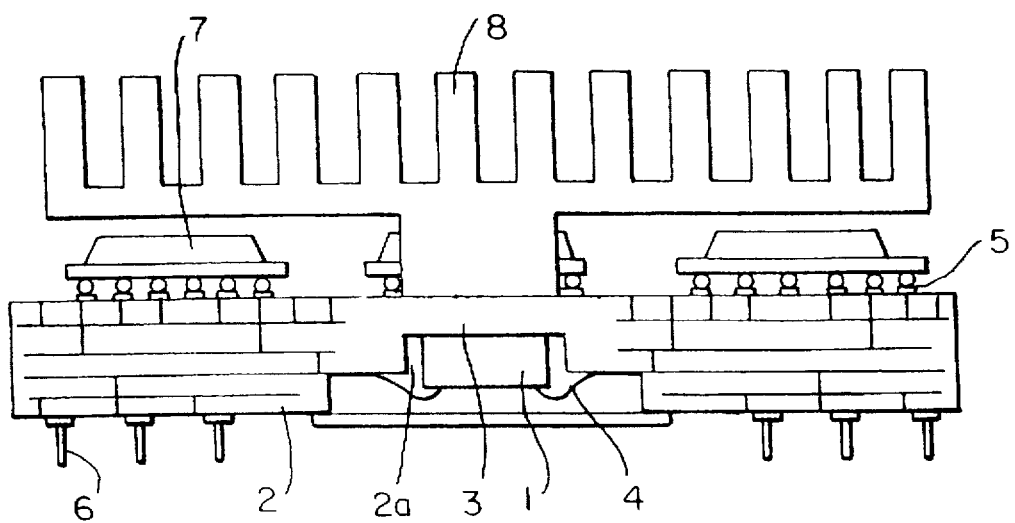
FIG. 8 is a cross-sectional view of a semiconductor module for a microprocessor according to a third embodiment of the present invention.

In this embodiment, the recess which houses the microprocessor semiconductor device 1 is defined by the through hole 2a and the copper plate 3. However, as shown in FIG. 8 a recess may be defined only by the plastic pin grid array 2, and the heat sink 8 may be mounted directly on the composite substrate of the plastic pin grid array 2 for radiating heat generated by the microprocessor semiconductor device 1. For radiating heat generated by the microprocessor semiconductor device 1 more efficiently, the heat sink 8 should preferably be mounted on the copper plate 3. The metal plate of good thermal conductivity is not limited to the copper plate 3, but may be a plate of another metal.

Figure 3:
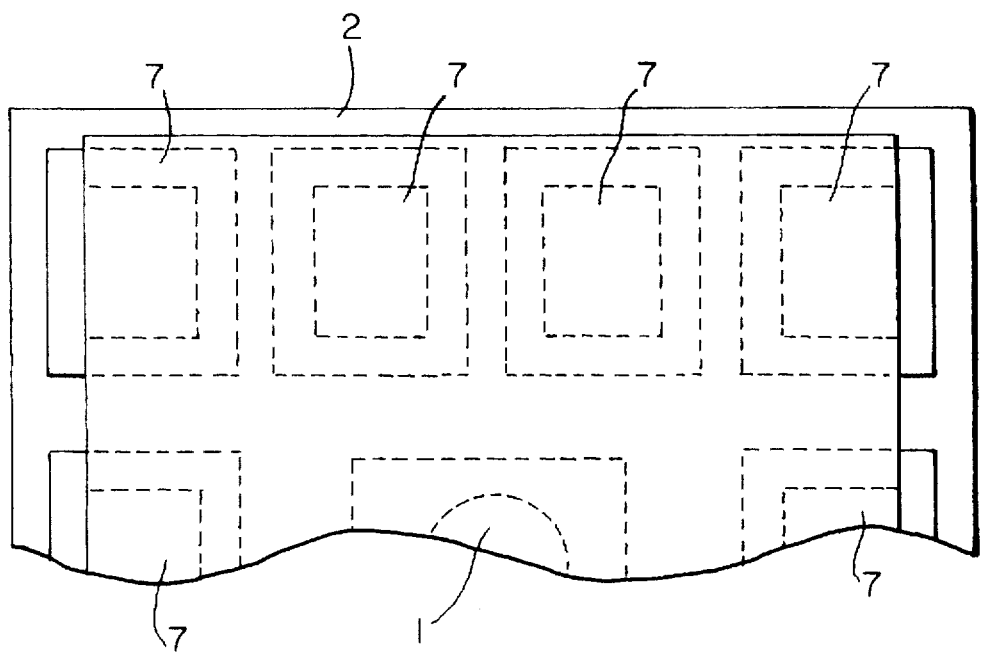
FIG. 3 is a fragmentary plan view of the semiconductor module shown in FIG. 2.
Figure 4:
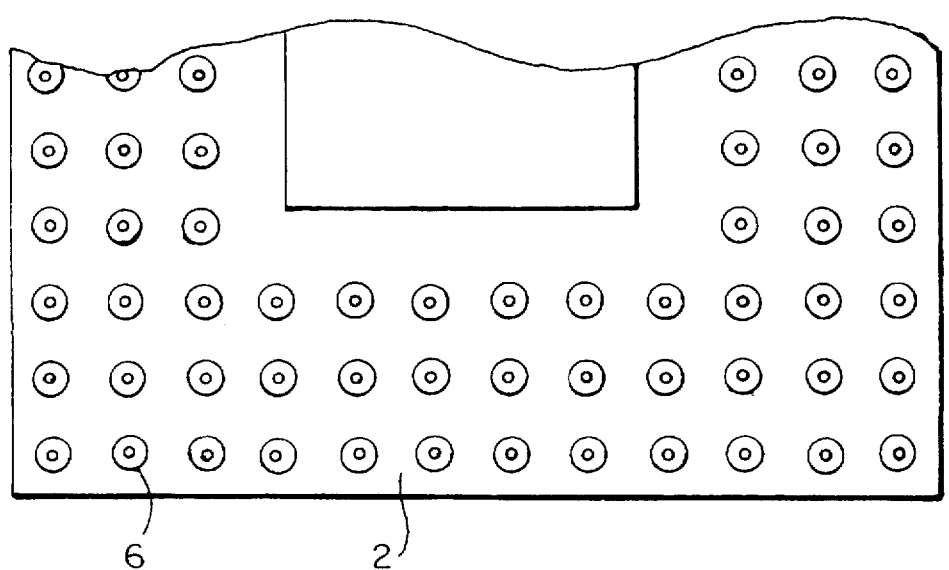
FIG. 4 is a fragmentary bottom view of the semiconductor module shown in FIG. 2.

As shown in FIG. 3, ten cache memories 7 each comprising a ball grid array package are mounted on the upper surface of the plastic pin grid array 2 in substantially equidistantly surrounding relationship to the microprocessor semiconductor device 1. Each of the cache memories 7 is connected to mount pads 5 disposed on the upper surface of the plastic pin grid array 2. Wires connected to the mount pads 5 are connected to the microprocessor semiconductor device 1 through gold wires 4. Since the cache memories 7 are connected to the mount pads 5, therefore, the cache memories 7 are connected to the microprocessor semiconductor device 1. As each of the cache memories 7 comprises a ball grid array package, it can easily be positioned on the plastic pin grid array 2 and can be produced with a good yield.

Wires extending from the microprocessor semiconductor device 1 for connection to an external circuit are connected to a plurality of pins 6 (see FIGS. 2 and 4) that are arrayed in a grid matrix on the lower surface of the plastic pin grid array 2. The pins 6 will serve as terminals which are used when the semiconductor module is installed on a wiring board (not shown).

As described above, the microprocessor semiconductor device 1 is mounted on the reverse side of the plastic pin grid array 2 by the copper plate 3. Therefore, the heat sink 8 may be mounted on the face side of the plastic pin grid array 2. As a result, heat generated by the microprocessor semiconductor device 1 can be radiated efficiently.

Since the cache memories 7 are disposed in substantially equidistantly spaced relationship to the microprocessor semiconductor device 1, the wires which interconnect the microprocessor semiconductor device 1 and the cache memories 7 are of substantially the same length, and are of minimal length, so that the microprocessor semiconductor device 1 can be used in ideal conditions. As a consequence, even if the microprocessor semiconductor device 1 is operated at high frequencies, any delay speed thereof is small and is substantially equal to each of the cache memories 7. Thus, the cache memories 7 can be used in ideal conditions for an increased processing speed.

The plastic pin grid array 2 comprises a composite substrate composed of glass fiber cloth and an organic material. Therefore, the coefficient of thermal expansion of the plastic pin grid array 2 is substantially equal to that of each of the cache memories 7 which comprises a ball grid array package including a composite substrate and also that of the wiring board on which the semiconductor module is mounted. Accordingly, soldered joints are prevented from being unduly strained, and the semiconductor module mounted on the wiring board is highly reliable.

Figure 5:
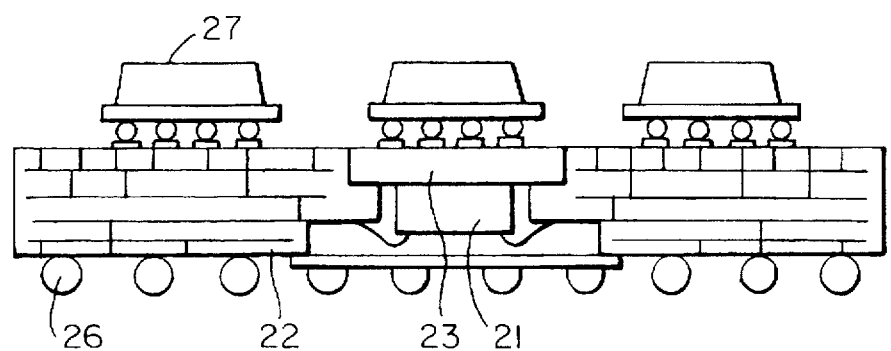
FIG. 5 is a cross-sectional view of a semiconductor module for a microprocessor according to a second embodiment of the present invention.
Figure 6:
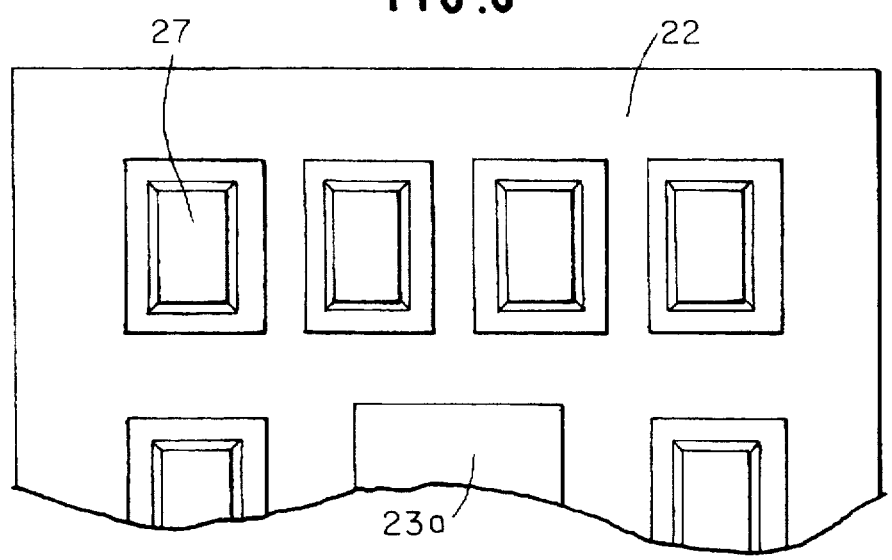
FIG. 6 is a fragmentary plan view of the semiconductor module shown in FIG. 5.
Figure 7:
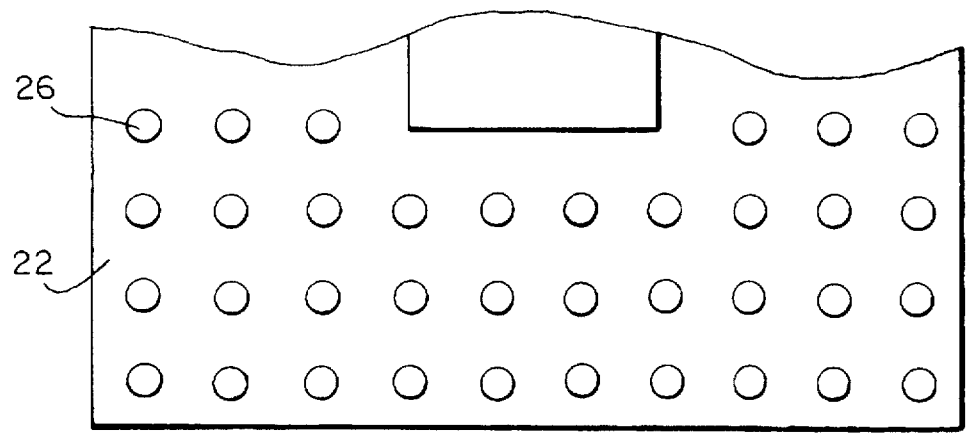
FIG. 7 is a fragmentary bottom view of the semiconductor module shown in FIG. 5.

2nd Embodiment:

A semiconductor module for a microprocessor according to a second embodiment of the present invention will be described below with reference to FIGS. 5 through 7.

In the second embodiment, the plastic pin grid array 2 (see FIG. 2) according to the first embodiment is replaced with a plastic ball grid array 22. As with the plastic pin grid array 2, the plastic ball grid array 22 comprises a stack of composite substrates each composed of glass fiber cloth and an organic material. A plurality of conductive balls 26 are disposed in a grid matrix on the lower surface of the plastic ball grid array 22. The conductive balls 26 will serve as terminals which are used when the semiconductor module is installed on a wiring board (not shown). Each of the balls 26 is made of solder or the like, for example, and connected to a wire extending from a microprocessor semiconductor device 21 for connection to an external circuit.

The microprocessor semiconductor device 21 is mounted on a copper plate 23 whose upper surface provides a heat-sink space 23a for mounting a heat sink. No heat sink is mounted in the heat-sink space 23a before the semiconductor module is installed on a wiring board. After the semiconductor module is installed on the wiring board, a heat sink which may be similar to the heat sink 8 according to the first embodiment is mounted in the heat-sink space 23a.

Other details, such as the structure by which the microprocessor semiconductor device 21 is mounted, the structure of each of cache memories 27, the arrangement of the cache memories 27, and the structure by which the cache memories 27 are installed, are identical to those of the first embodiment, and will not be described in detail below.

In the second embodiment, as described above, the plastic ball grid array 22 is employed. Therefore, the semiconductor module according to the second embodiment is installed on the wiring board by reflow soldering. If a heat sink were already mounted on the copper plate 23, the heat applied by reflow soldering would be dissipated by the heat sink, and junctions between the semiconductor module and the wiring board would not be heated as desired, with the result that the semiconductor module would not easily be soldered to the wiring board. According to the second embodiment, a heat sink is installed on the copper plate 23 after the semiconductor module is installed on the wiring board. Therefore, the semiconductor module can easily be installed to the wiring board without impairing solderability of the wiring board with the balls 26.

In the above embodiments, the plastic pin grid array package and the plastic ball grid array package have been illustrated as a plastic grid array package. However, a plastic land grid array package or a plastic column grid array package may be employed. The plastic land grid array package comprises a plurality of lands or pads arrayed in a matrix for use as terminals that can be received in respective sockets when the semiconductor module is installed on the wiring board. The plastic column grid array package comprises a plurality of conductive columns such as of solder arrayed in a matrix for use as terminals to be connected when the semiconductor module is installed on the wiring board.

As described above, the semiconductor module according to the present invention comprises a microprocessor semiconductor device mounted on the reverse side of a plastic grid array package and a plurality of cache memories mounted on the face side of the plastic grid array package. Therefore, a heat-radiating means may be installed on the face side of the plastic grid array package. While the plurality of cache memories are mounted on the plastic grid array package, the semiconductor module can efficiently radiate heat generated by the microprocessor semiconductor device.

While preferred embodiments of the present invention have been described using specific terms, such description is for illustrative purposes only, and it is to be understood that changes and variations may be made without departing from the spirit or scope of the following claims.

What is claimed is:

1. A semiconductor package for a microprocessor, comprising:

a plastic grid array package including a first surface supporting a plurality of terminals to be connected when the semiconductor package is mounted on a wiring board, said first surface having a recess defined therein;

a microprocessor semiconductor device housed in said recess;

a plurality of cache memories each comprising a ball grid array package, said cache memories being mounted on a second surface of said plastic grid array package, opposite to said first surface which supports said terminals; and heat-radiating means covering all of said plurality of cache memories and mounted on said surface on which said cache memories are mounted, at a position corresponding to said recess, for radiating heat generated by said plurality of cache memories and said microprocessor semiconductor device.

2. A semiconductor package according to claim 1, wherein said recess is defined by a through hole defined in said plastic grid array package and a metal plate having a top surface substantially coincident with the second surface of said plastic grid array package, closing said through hole at said second surface on which said cache memories are mounted, said heat-radiating means being mounted on said metal plate.

3. A semiconductor package according to claim 1, wherein said recess is defined centrally in said plastic grid array package, said cache memories being disposed in surrounding relationship to said recess.

4. A semiconductor package for a microprocessor, comprising:

a plastic grid array package including a surface supporting a plurality of terminals comprising conductive balls to be connected when the semiconductor package is mounted on a wiring board, said surface having a recess defined therein;

a microprocessor semiconductor device housed in said recess; and a plurality of cache memories each comprising a ball grid array package, said cache memories being mounted on a surface of said plastic grid array package opposite to said surface which supports said terminals;

said surface on which said cache memories are mounted including a portion corresponding to said recess, said portion serving as a region for installing heat-radiating means which covers all of said plurality of cache memories and operates for radiating heat generated by said plurality of cache memories and said microprocessor semiconductor device.

5. A semiconductor package according to claim 4, wherein said recess is defined by a through hole defined in said plastic grid array package and a metal plate closing said through hole at said surface on which said cache memories are mounted, said heat-radiating means being mounted on said metal plate.

6. A semiconductor package according to claim 4, wherein said recess is defined centrally in said plastic grid array package, said cache memories being disposed in surrounding relationship to said recess.

7. A semiconductor package for a microprocessor, comprising:

a plastic grid array package including a first surface;

a microprocessor semiconductor device mounted on said first surface;

a heat sink mounted on a second surface of said plastic grid array package opposite to said first surface;

said heat sink having a plurality of fins spaced from said second surface by a gap; and a plurality of cache memories mounted on said second surface, each and every one of said plurality of cache memories disposed in said gap in spaced relationship to each other.

8. A semiconductor package according to claim 1, wherein said heat-radiating means has a single leg which attaches said heat-radiating means to said second surface of said plastic grid array package at a location substantially adjacent to said microprocessor semiconductor.

9. A semiconductor package according to claim 8, wherein said cache memories are disposed in surrounding relationship to said recess and in substantially equidistantly spaced relationship to said microprocessor semiconductor device to thereby allow said microprocessor to operate at a high frequency substantially equal to the frequency of said plurality of cache memories.

10. A semiconductor package according to claim 9, whereby said plastic pin grid array has a thermal expansion co-efficient substantially equal to each of said plurality of cache memories comprised of a ball grid array package.

11. A semiconductor package according to claim 10, wherein said plurality of terminals are pins.

12. A semiconductor package according to claim 10, wherein said plurality of terminals are balls.

13. A semiconductor package according to claim 10, wherein said plurality of terminals are pads.

14. A semiconductor package according to claim 10, wherein said plurality of terminals are columns of solder.

15. A semiconductor package according to claim 1, wherein said plastic grid array package comprises a composite substrate composed of glass fiber cloth and an organic material.

16. A semiconductor package according to claim 15, wherein said cache memories ball grid array package comprises a composite substrate composed of glass fiber cloth and an organic material.

17. A semiconductor package according to claim 7, wherein said plastic grid array package comprises a composite substrate composed of glass fiber cloth and an organic material.

18. A semiconductor package according to claim 17, wherein said cache memories comprises a composite substrate composed of glass fiber cloth and an organic material.

19. A semiconductor package for a microprocessor, comprising:

a plastic grid array package including a surface supporting a plurality of terminals to be connected when the semiconductor package is mounted on a wiring board, said surface having a recess defined therein;

a microprocessor semiconductor device housed in said recess;

a plurality of cache memories each comprising a ball grid array package, said cache memories being mounted on a surface of said plastic grid array package opposite to said surface which supports said terminals; and heat-radiating means mounted on said surface on which said cache memories are mounted, at a position corresponding to said recess, for radiating heat generated by said microprocessor semiconductor device.

20. A semiconductor package according to claim 19, wherein said recess is defined by a through hole defined in said plastic grid array package and a metal plate closing said through hole at said surface on which said cache memories are mounted, said heat-radiating means being mounted on said metal plate.

21. A semiconductor package according to claim 19, wherein said recess is defined centrally in said plastic grid array package, said cache memories being disposed in surrounding relationship to said recess.

22. A semiconductor package for a microprocessor, comprising:

a plastic grid array package including a surface supporting a plurality of terminals comprising conductive balls to be connected when the semiconductor package is mounted on a wiring board, said surface having a recess defined therein;

a microprocessor semiconductor device housed in said recess; and a plurality of cache memories each comprising a ball grid array package, said cache memories being mounted on a surface of said plastic grid array package opposite to said surface which supports said terminals;

said surface on which said cache memories are mounted including a portion corresponding to said recess, said portion servicing as a region for installing heat-radiating means for radiating heat generated by said microprocessor semiconductor device, after said terminals are connected to the wiring board.

23. A semiconductor package according to claim 22, wherein said recess is defined by a through hole defined in said plastic grid array package and a metal plate closing said through hole at said surface on which said cache memories are mounted, said heat-radiating means being mounted on said metal plate.

24. A semiconductor package according to claim 22, wherein said recess is defined centrally in said plastic grid array package, said cache memories being disposed in surrounding relationship to said recess.

25. A semiconductor package for a microprocessor comprising:

a plastic grid array package including a first surface;

a microprocessor semiconductor device mounted on said surface;

a heat sink mounted on a second surface of said plastic grid array package opposite to said first surface;

said heat sink having a plurality of fins spaced from said second surface by a gap; and a plurality of cache memories mounted on said second surface and disposed in said gap in spaced relationship to each other.

* * * * *